(12) United States Patent
Leghissa

(10) Patent No.: US 7,698,804 B2
(45) Date of Patent: Apr. 20, 2010

(54) METHOD FOR PRODUCING A FULLY TRANSPOSED HIGH $T_c$ COMPOSITE SUPERCONDUCTOR AND A SUPERCONDUCTOR PRODUCED BY SAID METHOD

(75) Inventor: Martino Leghissa, Wiesenthau (DE)

(73) Assignee: Siemens Aktiengesellschaft, Munich (DE)

( * ) Notice: Subject to any disclaimer, the term of this patent is extended or adjusted under 35 U.S.C. 154(b) by 528 days.

(21) Appl. No.: 10/515,478

(22) PCT Filed: May 14, 2003

(86) PCT No.: PCT/DE03/01558

§ 371 (c)(1),
(2), (4) Date: Nov. 24, 2004

(87) PCT Pub. No.: WO03/100875

PCT Pub. Date: Dec. 4, 2003

(65) Prior Publication Data

US 2005/0227873 A1 Oct. 13, 2005

(30) Foreign Application Priority Data

May 27, 2002 (DE) .................... 102 23 542

(51) Int. Cl.
*H01B 12/02* (2006.01)

(52) U.S. Cl. .............. 29/599; 174/125.1; 505/236

(58) Field of Classification Search ............. 29/599; 174/125.1; 427/62, 63; 505/433, 231, 236
See application file for complete search history.

(56) References Cited

U.S. PATENT DOCUMENTS

| 2,249,509 | A | * | 7/1941 | Welch, Jr. et. al. | ............ 174/34 |
| 4,195,199 | A | | 3/1980 | Hillmann et al. | ......... 174/125.1 |
| 5,801,124 | A | * | 9/1998 | Gamble et al. | ............. 505/230 |
| 5,831,506 | A | * | 11/1998 | Crepel | ......................... 336/187 |
| 6,596,421 | B2 | | 7/2003 | Schmidt et al. | ............. 428/701 |
| 6,725,071 | B2 | * | 4/2004 | Albrecht et al. | ............. 505/231 |
| 2003/0024818 | A1 | | 2/2003 | Albrecht et al. | ............. 204/622 |

FOREIGN PATENT DOCUMENTS

| DE | 27 36 157 | 10/1979 |
| DE | 28 29 719 | 1/1980 |
| GB | 1142197 A | * 2/1969 |

(Continued)

OTHER PUBLICATIONS

Carr et al., "Filamentary YBCO Conductors For AC Applications", Jun. 1999, IEEE Transactions on Applied Superconductivity, vol. 9, No. 2, pp. 1475-1478.*

(Continued)

*Primary Examiner*—A. Dexter Tugbang
*Assistant Examiner*—Livius R Cazan
(74) *Attorney, Agent, or Firm*—Staas & Halsey LLP

(57) ABSTRACT

A fully transposed composite superconductor of the Roebel bar type is produced. The superconductor is formed from combines superconductors. The process step for forming the subconductors, which are being configured with a lateral projection into a region of a neighbouring subconductor, is separated from the stranding step. Carrier strips, which are coated with the superconductive material, are used as the conductors.

9 Claims, 1 Drawing Sheet

FOREIGN PATENT DOCUMENTS

| | | |
|---|---|---|
| WO | WO96/39705 | 12/1996 |
| WO | WO00/46863 | 8/2000 |
| WO | WO01/08169 A2 | 2/2001 |
| WO | WO01/59909 A1 | 8/2001 |
| WO | WO 0159909 A1 * | 8/2001 |

OTHER PUBLICATIONS

Eckelmann et al., "AC losses in multifilamentary Bi(2223) tapes with an interfilamentary resistive carbonate barrier", 1998, Physica C 310, pp. 120-126.*

Goldacker et al., "ROEBEL Assembled Coated Conductors (RACC): Preparation,Properties and Progress", IEEE Transactions on Applied Superconductivity Proceedings of ASC 2006, Aug. 27-Sep. 1, 2006, Seattle, USA, pp. 1-4.*

Goldacker et al., "High current DyBCO-ROEBEL Assembled Coated Conductor (RACC)", EUCAS2005, Sep. 11-15, 2005, Vienna Austria.*

Daley et al., "Superconducting Power: Meeting the Challenges", 2001, IEEE, pp. 427-431.*

Futaki et al., "A.C. Transport Properties of the High-Tc Superconducting Cable Consist of the Transposed Segment Conductor", Advances in Superconductivity XI., Proceedings of 11th International Symposium on Superconductivity (ISS'98), Nov. 1998, pp. 971-974.

Adam et al., "Rutherford Cables with Anisotropic Transverse Resistance", IEEE Transactions on Applied Superconductivity, vol. 7, No. 2, Jun. 1997, pp. 958-961.

Iwakuma et al., "Electronmagnetic Properties in Parallel Conductors Composed of Bi2223 Multifilamentary Wires for Power Transformer Windings",", IEEE Transactions on Applied Superconductivity, vol. 7, No. 2, Jun. 1997, pp. 298-301.

Iijima et al., "Biaxially Aligned $YBa_2Cu_3O_{7-x}$ Thin Film Tapes", Physica C 185-189, 1991, Elsevier Science Publishers B.V., North-Holland, pp. 1959-1960.

Wu et al., "High Current $YBa_2Cu_3O_{7-\delta}$ Thick Films on Flexible Nickel Substrates with Textured Buffer Layers", Applied Physics Letter 65 (15), Oct. 10, 1994 pp. 1961-1963.

Iijima et al., "Self-Field AC Losses in Biaxially Aligned Y-Ba-Cu-O Tape Conductors", Applied Physics Letter'71 (18), Nov. 3, 1997, pp. 2695-2697.

* cited by examiner

METHOD FOR PRODUCING A FULLY TRANSPOSED HIGH $T_c$ COMPOSITE SUPERCONDUCTOR AND A SUPERCONDUCTOR PRODUCED BY SAID METHOD

CROSS REFERENCE TO RELATED APPLICATIONS

This application is based on and hereby claims priority to PCT Application No. PCT/DE03/01558 filed on May 14, 2003 and German Application No. 102 23 542.2, the contents of which are hereby incorporated by reference.

BACKGROUND OF THE INVENTION

The method relates to a method for producing a fully transposed composite superconductor with an at least approximately rectangular cross section, which contains two or more conductor elements that are combined in the form of a transposed conductor bar, are composed of high-$T_c$ superconductor material and each have an at least approximately rectangular cross section with a width B. In the method, the conductor elements are produced in a shape with a lateral projection, on the plane of the width B, into an area of an adjacent conductor element, and the conductor elements are twisted with one another. The invention also relates to a conductor produced using this method. A conductor such as this and the method for its production are disclosed in WO 01/59909.

High-power applications of high-$T_c$ superconductors (referred to as HTC conductors in the following text), for example in order to produce a transformer, machine or other magnet windings, require low-loss conductors with alternating-current ratings up to the kiloamp range. In the past, only small cross section HTC ribbon conductors have been available, with current carrying capacities of up to a few 100 $A_{eff}$ at 77 K in their own magnetic field. Furthermore, these ribbon conductors are mechanically highly sensitive, and their electrical characteristics are strongly dependent on the magnitude and the direction of the local magnetic field in which they are located.

There is therefore good reason to construct technically useable high-current superconductors composed of a large number of individual, parallel ribbon conductors, in the form of so-called composite conductors, for example according to DE 27 36 157 B2. Furthermore, the ribbon conductors (which are referred to in the following text as conductor elements or individual conductors) of such composite conductors are isolated from one another and are systematically transposed or twisted for alternating-current applications at industrial frequencies (in general up to 60 Hz), in order in this way to ensure a uniform current distribution throughout the entire cross section, and low alternating-current losses associated with this.

Corresponding transposed composite conductors, which are also referred to as twisted conductors or cable conductors, with a high alternating-current carrying capacity are in principle known. They may be designed as follows:

as so-called "conductor bars", for example in the form of transposed conductor bars or transposed conductors, with conductor elements composed of copper, for example for large alternating-current machines, as so-called "twisted conductors", with conductor elements composed of copper for transformers or inductors, or as so-called transposed "flat or round conductors" with conductor elements composed of metallic superconductors such as NbTi in copper (see the cited DE 27 36 157 B2).

In principle, transposition of HTC conductors is also known, in order to increase the alternating-current carrying capacity. In this context, specific configuration analyses and design information relate to:

continuous transposition of round or virtually round HTC conductors to form single or multiple cables (see, for example, the so-called "Rutherford Cable" in "IEEE Trans. Appl. Supercond.", Vol. 7, No. 2, June 1997, pages 958 to 961), achievement of a continuous transposition effect in power cables by variation of the pitch of twisted ribbon HTC conductor elements from one conductor layer to the next (so-called "Pitch Adjustment"; see WO 96/39705), and so-called "in-situ transposition", that is to say step-by-step transposition during winding production directly on a winding former, for example a transformer winding (see, for example, "IEEE Trans. Appl. Supercond.", Vol. 7, No. 2, June 1997, pages 298 to 301).

One possible embodiment of a fully transposed HTC composite superconductor with an at least approximately rectangular cross section, which contains two or more conductor elements combined in the form of a transposed conductor bar, as well as an apparatus for its production can be found in WO 01/59909 A1, which was cited in the introduction. One characteristic of this composite conductor is lateral bending of its ribbon conductor elements with a predetermined bending radius and a predetermined bending zone length. The production of the corresponding "upright bending zones", in which a change takes place to an area of an adjacent conductor element, is in this case carried out during the process of transposition. This process requires specific minimum dimensions with respect to the bending radii and bending zones, specifically, for each conductor element, a bending radius R which is greater than one hundred times the width B of the conductor element, and a bending or changeover zone length H which is greater than twenty times the width B. The full-transposition length of the known HTC composite conductor is therefore relatively large. The ribbon conductor elements which contain a HTC material based on the BiSrCaCuO system are preferably used for this purpose. Corresponding conductor elements generally have cores composed of this HTC material which are embedded in a normally conductive matrix, preferably composed of silver or of a silver alloy.

In addition to such single-core or multicore conductors (or conductor elements), corresponding HTC conductors in ribbon form may also be produced by coating a ribbon support on one or both sides with an HTC material (see, for example, "Physica C", Volumes 185 to 189, 1991, pages 1959 to 1960; "Appl. Phys. Left.", Volume 65, No. 15, Oct. 10, 1994, pages 1961 to 1963; "Appl. Phys. Left.", Volume 71, No. 18, Nov. 3, 1997, pages 2695 to 2697 or WO 00/46863). However, conductors such as these cannot be used without further measures for a design based on the known HTC composite conductor, since there is a risk there of damage to the HTC layer that is applied to the mounting ribbon, as a result of the upright bending step.

SUMMARY OF THE INVENTION

One possible object of the present invention is therefore to design the method with the features mentioned initially such that it can be used to produce even fully transposed HTC composite conductors with conductor elements composed of coated supporting ribbons.

The inventor proposes for the separation of the shaping of the conductor elements from the twisting, with conductor elements being provided with supporting ribbons which are coated with the superconductive high-$T_c$ material.

The advantages associated with this refinement of the method are that it avoids the step which has been mentioned of upright bending of the finished superconductor. This allows the use of mounting ribbons coated with the HTC material as conductor elements, which cannot be subjected to upright bending owing to their specific layer structure. Furthermore, this allows production of relatively short changeover zones which, in consequence, also lead to correspondingly shorter full-transposition lengths.

Thus, in particular, the shaping can be carried out before the step of coating with the superconductor material, for example by a bending step for the supporting ribbon, or by a cutting step relating to an initial body of the supporting ribbon, from which the desired shape is cut.

Instead of this, the shaping can also be carried out by at least one cutting step relating to an initial body of the supporting ribbon which is already coated with the superconductor material.

Thus, the composite superconductor may advantageously be characterized by the relationship B<H<20 B, where H is the extent of the changeover zone in the current-carrying direction of the composite superconductor. A composite superconductor such as this has comparatively short full-transposition lengths with short changeover zones for its conductor elements.

In principle, it is possible to use different conductor elements, for example with and without superconductor material, and/or with a different cross section, for construction of the composite superconductor. However, in order to achieve a uniform current distribution over the entire composite conductor cross section, it is advantageous to combine conductor elements which are designed in the same way.

The fixing means for the composite superconductor may, in particular, be adhesively bonded joints or soldered joints for the conductor elements. Bandaging or braiding is preferably provided, in order to provide the composite superconductor with sufficient flexibility. In this case, the bandaging or braiding may, in particular, be designed in an appropriately transparent form or form that allows suction with respect to possible subsequent impregnation with a synthetic resin or with respect to good coolant access.

With respect to reducing the alternating-current losses during use of the composite superconductor, the composite superconductor is advantageously designed using conductor elements, at least some of which are electrically isolated from one another.

A material from the family $(RE)M_2Cu_3O_x$ is advantageously provided as the superconductive high-$T_c$ material for the conductor elements of the composite conductor, with the component RE containing at least one rare earth metal (including yttrium), and the component M containing at least one alkaline earth metal. In particular, the superconductor material is of the $YBa_2Cu_3O_x$ type. Layers composed of corresponding HTC materials can be deposited on known supporting ribbons with a high current carrying capacity using known methods.

Composite superconductors according to the invention are therefore advantageously distinguished by a high current carrying capacity and the capacity for large-scale production, in terms of long conductor lengths. They can be used in particular in a high-power device operated using alternating current, for example for transformers, electrical machines or magnets.

Further advantageous refinements of the production method and of the composite superconductor produced using it will become evident.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
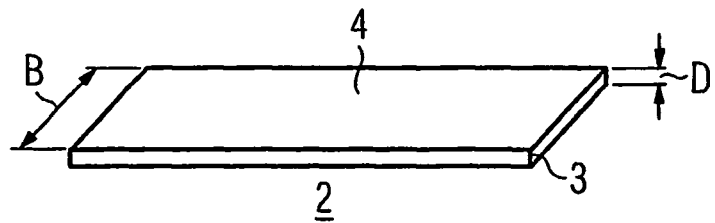
FIG. 1 shows a conductor element which can be used for a composite superconductor.

Reference will now be made in detail to the preferred embodiments of the present invention, examples of which are illustrated in the accompanying drawings, wherein like reference numerals refer to like elements throughout.

Conductor elements which can be used for composite superconductors to be produced for the composite superconductor are generally known. As is shown in the oblique view in FIG. 1, a corresponding conductor element 2 contains a mounting ribbon 3, which is generally provided with at least one buffer layer. A layer 4 composed of an HTC material is deposited on this buffer layer. In addition to materials from the BiSrCaCuO system, materials from the family $(RE)M_2Cu_3O_x$, in particular, may be used for this layer. In this case, the RE (rare earth) components should contain at least one rare earth element (including Y), such as Y. The M component is at least one alkaline earth element such as barium. The main representative of this type is $YBa_2Cu_3O_x$ (where $x=7-\delta$, so-called YBCO). At least one of the components of this material may, of course, be at least partially replaced by another from the respective group.

Nickel (Ni) or a nickel alloy, for example, may be used as the material for the supporting ribbon 3. The surface of the support may, in particular, be biaxially textured. Corresponding ribbon substrates are known by the designation "RABITS" ("Rolling-Assisted-Biaxially-Textured-Substrates"), (see, for example, "Appl. Supercond.", Vol. 4, Nos. 10-11, pages 403 to 427).

Figure 2:
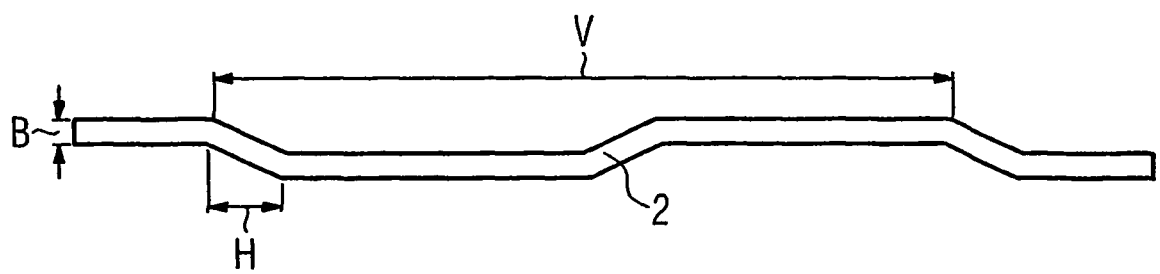
FIG. 2 shows the shaping of an individual conductor element.
Figure 3:
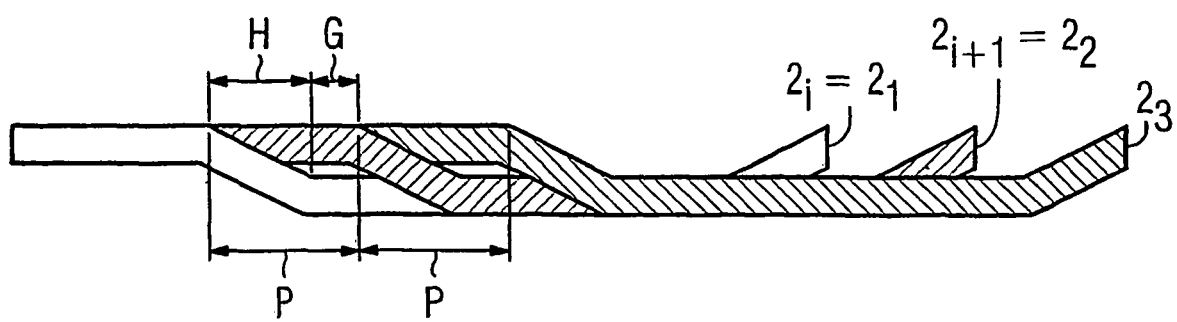
FIG. 3 shows two or more such conductor elements as shown in FIG. 2, as can be provided for a composite superconductor produced according to one embodiment of the invention.

Two or more such conductor elements which are combined in the form of a transposed conductor bar result in a fully transposed composite superconductor with an at least approximately rectangular cross section whose design corresponds essentially to that of the composite conductor which is disclosed in WO 01/59909 A1. Based on the notation used there, the following notations have been chosen for the exemplary embodiment shown in FIGS. 2 and 3:

H=changeover zones (or upright bending zone)
G=straight zone without any changeover
P=H+G=periodic changeover zone separation
V=full transposition length
B=width of the conductor element
D=thickness of the conductor element The length of the changeover zones H should preferably be governed by the following relationship:

$$B<H<20\cdot B.$$

Furthermore, the following relationship should be satisfied by a composite superconductor whose number of conductor elements is N:

$$V=N\cdot B$$

In order to produce a composite conductor, the process of shaping the changeover zones H (for example by bending or cutting) and of combination (or twisting) of the conductor elements $2_i$ (where i=1 . . . to N) are separated, in which case the two following variants a) and b) are possible:

a) the changeover zones are shaped by bending or cutting the mounting ribbon from a larger body such as metal sheet before coating with the HTC material;

b) the shaping of the changeover zones is carried out by cutting a ribbon or an initial body after being coated with the HTC material. In this case, an initial body should be understood as meaning a body which is broader than the width B and from which at least one conductor element can be cut out.

Production Based on Variant a)

1) Cutting or bending of a supporting ribbon, which may have been pre-treated (for example stainless steel ribbons or rolling-textured metal ribbons such as RABITS ribbons composed of nickel alloys), corresponding to the embodiment shown in FIG. 1 with changeover zones H and straight zones G 2) Application of one or more suitable buffer layers (composed, for example, of YSZ, $CeO_2$, MgO)

3) Application of a layer of the HTC material YBCO (or of a related HTC material from the "123" material family $(RE)_1 M_2Cu_3O_x$)

4) If appropriate, application of metallic covering layers or of metallic sheaths 5) If appropriate, sheathing with an isolation layer 6) Combination of N such conductor elements to form a fully transposed composite conductor, with respectively adjacent conductor elements $2_i$, $2_{i+1}$ being offset with respect to one another by a periodic changeover zone integral P 7) If appropriate, fitting of a bandage or braiding to the entire composite conductor.

Production based on variant b)

1) Cutting of a ribbon conductor with a superconductor material such as YBCO (or of a related HTC material from the "123" material family) corresponding to the embodiment shown in FIG. 1 with changeover zones H and straight zones G from a larger, coated body 2) If appropriate, sheathing with an isolation layer 3) Combination of N such conductor elements to form a fully transposed composite conductor, with respectively adjacent conductor elements being offset through a periodic changeover zone integral P with respect to one another 4) If appropriate, application of a bandage or braiding to the entire composite conductor. According to one specific exemplary embodiment, the following are chosen as typical geometric variables:

Width of the conductor elements B 1 mm . . . 10 mm

Thickness of the conductor elements D 0.02 mm . . . 0.5 mm

Current per conductor element (at 77K without any external magnetic field) $I_{TL}$=10 A . . . 1000 A.

The number of conductor elements N is governed by the desired total current $I_{tot}$ where $N=I_{tot}/I_{TL}$.

The invention has been described in detail with particular reference to preferred embodiments thereof and examples, but it will be understood that variations and modifications can be effected within the spirit and scope of the invention covered by the claims which may include the phrase "at least one of A, B and C" or a similar phrase as an alternative expression that means one or more of A, B and C may be used, contrary to the holding in *Superguide v. DIRECTV,* 69 USPQ2d 1865 (Fed. Cir. 2004).

The invention claimed is:

1. A method for producing a fully transposed composite superconductor with an at least approximately rectangular cross section, comprising:

first producing a plurality of individual shaped and coated conductor elements, each having a ribbon shape with an approximately rectangular cross section corresponding to an individual shape of the conductor element in a transposed arrangement of the composite superconductor;

wherein each shaped and coated conductor element has at least partially a coating of a superconductive high-$T_C$ material, each shaped and coated conductor element satisfies the relationship B<H<20·B, where B is a width of the shaped and coated conductor element and H is the length of an upright bending zone of the conductor element, in a current-carrying direction in the transposed arrangement, and upright bending of the conductor elements in the coated state is avoided; and after producing the individual shaped and coated conductor elements, assembling the shaped and coated conductor elements to said composite superconductor in the transposed arrangement by fitting the individual shaped and coated conductor elements with one another in a process separate from producing each conductor element, wherein the conductor elements are shaped by cutting an initial body to a desired shape, and the initial body is coated with the superconductive high-$T_C$ material before the conductor elements are cut therefrom, to the desired shape.

2. The method as claimed in claim 1, wherein each conductor element is formed from a supporting ribbon coated with the superconductive high-$T_C$ material, and the supporting ribbon is formed from a steel alloy or a nickel alloy.

3. The method as claimed in claim 1, wherein the conductor elements are fixed to one another by adhesive bonding or soldering joints in the conductor elements to one another.

4. The method as claimed in claim 1, wherein the conductor elements are fixed to one another by bandaging or braiding the conductor elements.

5. The method as claimed in claim 4, wherein bandaging or braiding the conductor elements forms a hollow interior portion within the composite superconductor, for an impregnation medium or a coolant.

6. The method as claimed in claim 1, wherein at least some of the conductor elements are electrically isolated from one another.

7. The method as claimed in claim 1, wherein the superconductive high-$T_C$ material is a $REM_2Cu_3O_X$ material, with RE being at least one element of yttrium and the rare earth metals, and M being at least one alkaline earth metal.

8. The method as claimed in claim 7, wherein the superconductive high-$T_C$ material is a $YBa_2Cu_3O_x$ material.

9. A fully transposed composite superconductor produced by a process comprising:

first producing a plurality of individual shaped and coated conductor elements, each having a ribbon shape with an approximately rectangular cross section corresponding to an individual shape of the conductor element in a transposed arrangement of the composite superconductor;

wherein each shaped and coated conductor element has at least partially a coating of a superconductive high-$T_C$ material, each shaped and coated conductor element satisfies the relationship B<H<20·B, where B is a width of the shaped and coated conductor element and H is the length of an upright bending zone of the conductor element, in a current-carrying direction in the transposed arrangement, and upright bending of the conductor elements in the coated state is avoided; and after producing the individual shaped and coated conductor elements, assembling the shaped and coated conductor elements to said composite superconductor in the transposed arrangement by fitting the individual shaped and coated conductor elements with one another in a process separate from producing each conductor element, wherein the conductor elements are shaped by cutting an initial body to a desired shape, and the initial body is coated with the superconductive high-$T_C$ material before the conductor elements are cut therefrom, to the desired shape.

* * * * *

UNITED STATES PATENT AND TRADEMARK OFFICE
CERTIFICATE OF CORRECTION

PATENT NO. : 7,698,804 B2
APPLICATION NO. : 10/515478
DATED : April 20, 2010
INVENTOR(S) : Martino Leghissa It is certified that error appears in the above-identified patent and that said Letters Patent is hereby corrected as shown below:

Title Page; item (57);
First Page, Column 2 (Abstract), Line 3, change "combines superconductors." to --combined subconductors.--.

First Page, Column 2 (Abstract), Line 4, after "are" delete "being".

First Page, Column 2 (Abstract), Line 8, change "conductors." to --subconductors.--.

Signed and Sealed this

Third Day of August, 2010

David J. Kappos
*Director of the United States Patent and Trademark Office*